United States Patent [19]

Comerford et al.

[11] 4,079,404
[45] Mar. 14, 1978

[54] SELF-ALIGNING SUPPORT STRUCTURE FOR OPTICAL COMPONENTS

[75] Inventors: Liam David Comerford, Croton-on-Hudson; John David Crow, Mohegan Lake; Robert Allan Laff, Yorktown Heights; Eric Gung-Hwa Lean, Mahopac; Michael John Brady, Brewster, all of N.Y.

[73] Assignee: International Business Machines Corporation, Armonk, N.Y.

[21] Appl. No.: 756,042

[22] Filed: Dec. 30, 1976

[51] Int. Cl.² .................. H01L 31/12; G02B 5/14
[52] U.S. Cl. ........................... 357/19; 357/18; 350/96.11
[58] Field of Search ............... 357/19, 18, 17; 350/96 C, 96 WG, 162 R

[56] References Cited

U.S. PATENT DOCUMENTS

| | | | |
|---|---|---|---|
| 3,774,987 | 11/1973 | Boivin | 350/96 WG |
| 3,841,733 | 10/1974 | Ebersole | 350/160 R |
| 3,864,018 | 2/1975 | Miller | 350/96 C |
| 3,976,358 | 8/1976 | Thompson | 350/96 C |
| 3,981,023 | 9/1976 | King | 357/17 |
| 4,029,390 | 6/1977 | Chinnock | 350/96 C |

OTHER PUBLICATIONS

Weidel, *Optics Communication,* vol. 12, No. 1, Sept. 1974.
*Electronic Letters,* vol. 10, No. 14, July 11, 1974, p. 280.

*Primary Examiner*—Martin H. Edlow
*Attorney, Agent, or Firm*—Robert E. Sandt; Ronald L. Drumheller

[57] ABSTRACT

An optical assembly structure wherein miniature optical components such as lasers, modulators, lenses, thin-film and fiber-optic waveguides, and photodetectors are critically aligned and supported for coactive operation by means of two or more wafers which are formed with complementary grooves and mortises to support the loose optical components such as lenses and fiber-optic waveguides and to receive alignment rails to insure the relativity of the wafers, which also have formed integral therewith optical elements such as waveguides, modulators, and lasers, to produce an integrated optical assembly somewhat in the manner of an "optical bench," wherein the bench structure also provides an active optical element.

10 Claims, 4 Drawing Figures

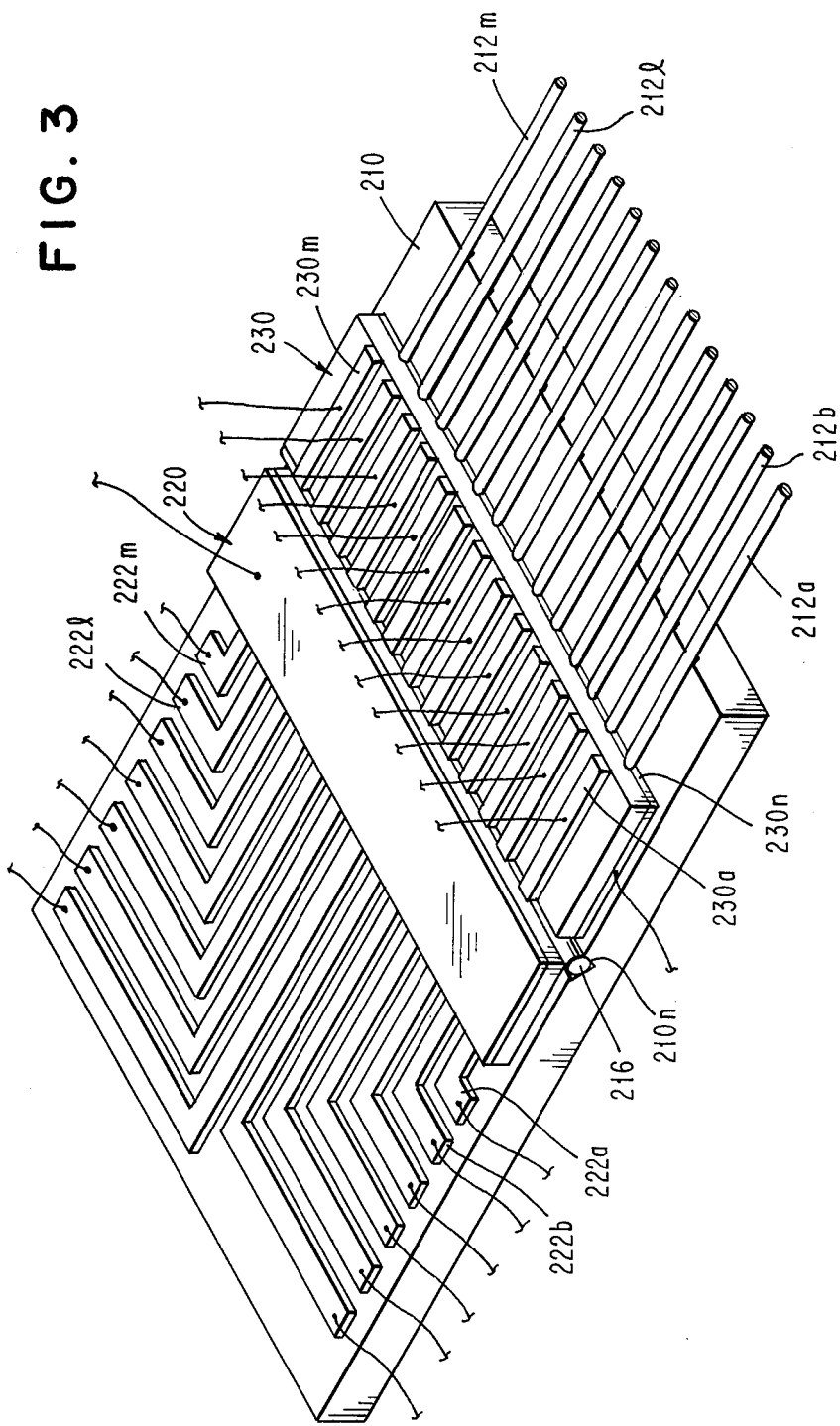

SELF-ALIGNING SUPPORT STRUCTURE FOR OPTICAL COMPONENTS

BACKGROUND OF THE INVENTION

1. Field of the Invention

The present invention relates to optical apparatus and more specifically to integrated optical assemblies.

2. Description of the Prior Art

It is known to employ complementary Vee-grooves in two mating members to align and clamp fiber optic waveguides for splicing purposes. An example of a structure of this nature is to be found in the Miller U.S. Pat. No. 3,864,018 issued Feb. 4, 1975.

It is also known to employ a crystallographically etched Vee-groove in a substrate having a thin film planar waveguide integral therewith to support an optical fiber in alignment with the waveguide. U.S. Pat. No. 3,774,987, issued Nov. 27, 1973 to L. P. Boivan shows such a structure.

The instant invention combines and expands the principles of the prior art to provide an optical assembly wherein two or more wafers having a pattern of complementary grooves, rails, and cavities preferably formed by crystallographic etching, are provided with integral optical and electro-optical components which are coactively aligned by means of the complementary grooves and rails to function as an integrated optical system, and the complementary grooves and cavities are further adapted to support and align loose optical components such as lenses and optical fibers for coaction with the optical components integral with the wafers.

SUMMARY OF THE INVENTION

It is therefore an object of this invention to provide an optical assembly wherein a plurality of optical components are supported and aligned in coactive relationship by means of at least two members having a complementary pattern of matching geometric shapes, including grooves and cavities, wherein the members are provided with integral optical and electrical components, and loose optical components are confined and supported by the complementary matching grooves and cavities, and the wafers are critically aligned by the complementary pattern of geometric shapes.

A further object is to secure the alignment of two optical elements by providing complementary grooves in opposing mating surfaces of the two elements and utilizing a cylindrical rail member in coactive engagement with the grooves of both said members.

A further object is to provide a structure in accordance with the preceding object wherein the cylindrical rail member is an optical fiber which coacts optically with the optical elements of the members.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 3 is also a perspective view of an optical assembly in accordance with this invention with an optical modulator.

DETAILED DESCRIPTION OF THE DRAWINGS

Figure 1:
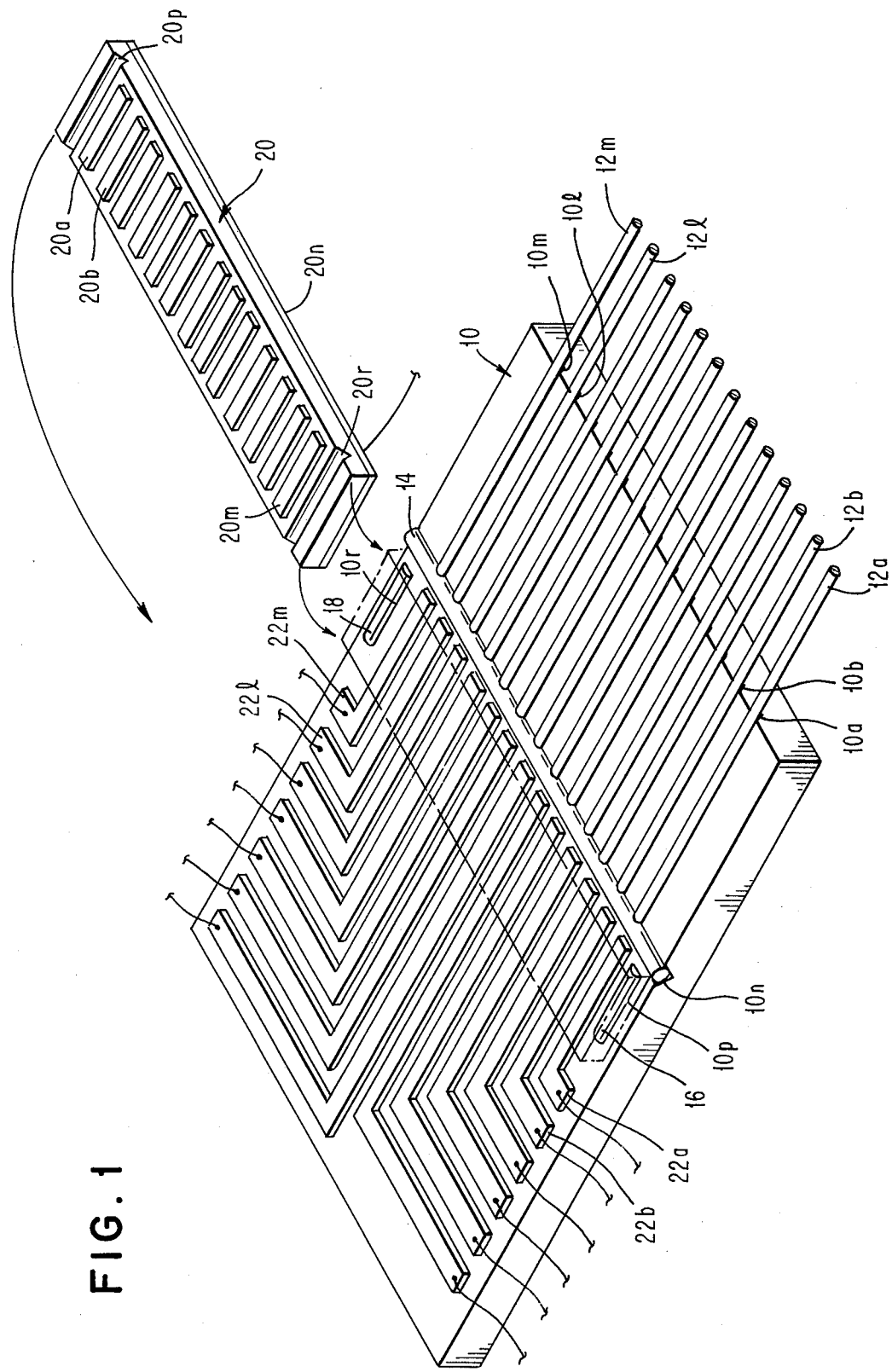
FIG. 1 is a perspective view of an optical assembly in accordance with the present invention.

In FIG. 1 the silicon wafer 10 is oriented with its $<100>$ axes perpendicular to the wafer surface. This orientation facilitates the etching of a series of parallel Vee-shaped grooves 10a thru 10m and the intersecting perpendicular groove 10n. These are etched into the major face through an oxide mask using a solution of ethylene diamine, pyrocatechol, and water as described by M. J. Declerg, et. al., *J. Electrochem. Soc.*, 122, p. 545 (April 1975). The etch rate using this solution is anisotropic with the $<111>$ faces being etched most slowly, thus forming the desired Vee-shaped grooves. The accuracy in the position and dimensions of the photolithographically defined oxide mask and the control over the etching processes result in submicron tolerances in the grooves.

A fiber optic waveguide (12a–12m) is laid into each of the parallel grooves 10a–10m with its end abutting a cylindrical lens 14 laid into the perpendicular groove 10n. The fiber optic waveguides are typically 85–90 μm with a numerical aperture of 0.15. The cylindrical lens, also a fiber has a diameter of 125 μm. It acts to collect the divergent light from a junction laser 20 pckage and couple it into the individual optical fibers.

The laser package 20 is preferably a GaA1As double heterostructure laser in which oxide stripe and oxygen ion implantation techniques plus the plurality of discrete electrodes 20a–20m segment the wafer into a plurality of individually controllable junction lasers, the active layer of which aligns with the axis of the cylindrical lens 14 when the wafer is rotated, as shown by the arcuate arrows, to overly the wafer 10.

To insure the accurate relative alignment of the laser package 20 with the wafer 10 additional Vee-shaped grooves 10p and 10r are etched into the wafer 10 and complementary grooves 20p and 20r are etched into the laser package 20. Two short pieces of optical fibers 16 and 18 fit within these Vee-shaped grooves and locate the laser package laterally with respect to the wafer 10. The longitudinal locaton is determined by the lens 14 against which the laser package abuts. The electrodes 20a through 20m are pretinned with an indium or tin solder so that they may be bonded to the contacts 22a thru 22m deposited on the wafer 10 to provide electrical integrity and to fix the laser package in position. These contacts permit individual potentialization of the discrete lasers in the package 20, a common electrode 20n providing the return.

As an alternative means to align the laser package with the wafer 10, pyramided sockets may be eteched into both the wafer 10 and the laser chip 20 and beads substituted for the cylinders. A third method is to etch a vee groove in one member and a complementary Vee-shaped way in the other member. Generic to all methods is the preferential etching of complementary geometric shapes to effect the registration.

In the laser array 20 the divergence angles were measured from 40°–50° perpendicular to the junction plane and 6°–10° parallel to the junction plane. This laser output can be collimated by the cylindrical lens to less than 6° perpendicular to the junction while not degrading the output parallel to the junction. Total throughput efficiencies approaching 70% have been measured.

The alignment scheme described with respect to FIG. 1 can be expanded to incorporate preformed active elements in the silicon substrate. Since it is a semiconductor, the silicon may be doped and provided with electrodes to introduce other functions into the integrated package.

Figure 1A:
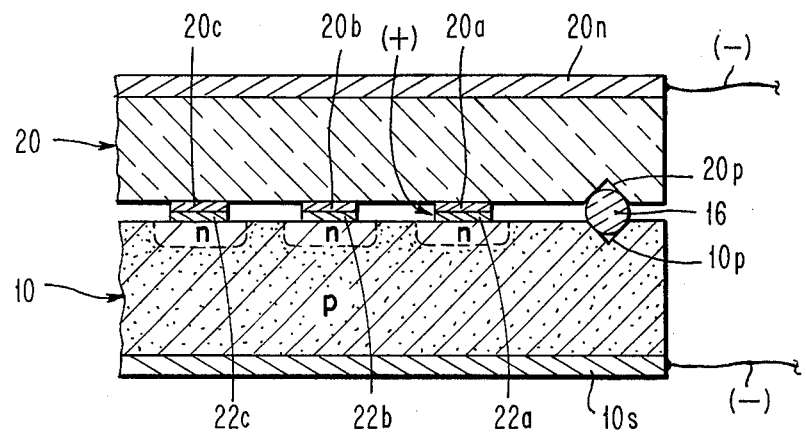
FIG. 1A is a partial transverse sectional view of the optical assembly of FIG. 1 with active elements in the substrate.

One such function is shown in FIG. 1A which is a partial transverse section taken through the wafer 10 and overlying laser package 20 with additions to the wafer 10 to exploit the semiconducting properties of the silicon. The sectional view shows the laser package 20 with its common electrode 20n, individual electrodes 20a, 20b, 20c bonded to corresponding contacts 22a, 22b, and 22c and the complementary Vee-shaped grooves 20p and 10p and alignment rail 16. In addition a P-N junction is created at each contact area 22a etc. by addition of an N-region in the P type material of the wafer 10. Each of these individual junctions is back-biased by applying a negative potential on electrode 10s added to the bottom of the wafer 10 in common to all of the newly-formed junctions, and a positive potential to the individual contacts 22a etc. The elctrode 20n is negatively biased to induce the lasing action. These back-biased P-N junctions are thermally sensitive and are used to monitor the performance of each of the lasers in the array.

Figure 2:
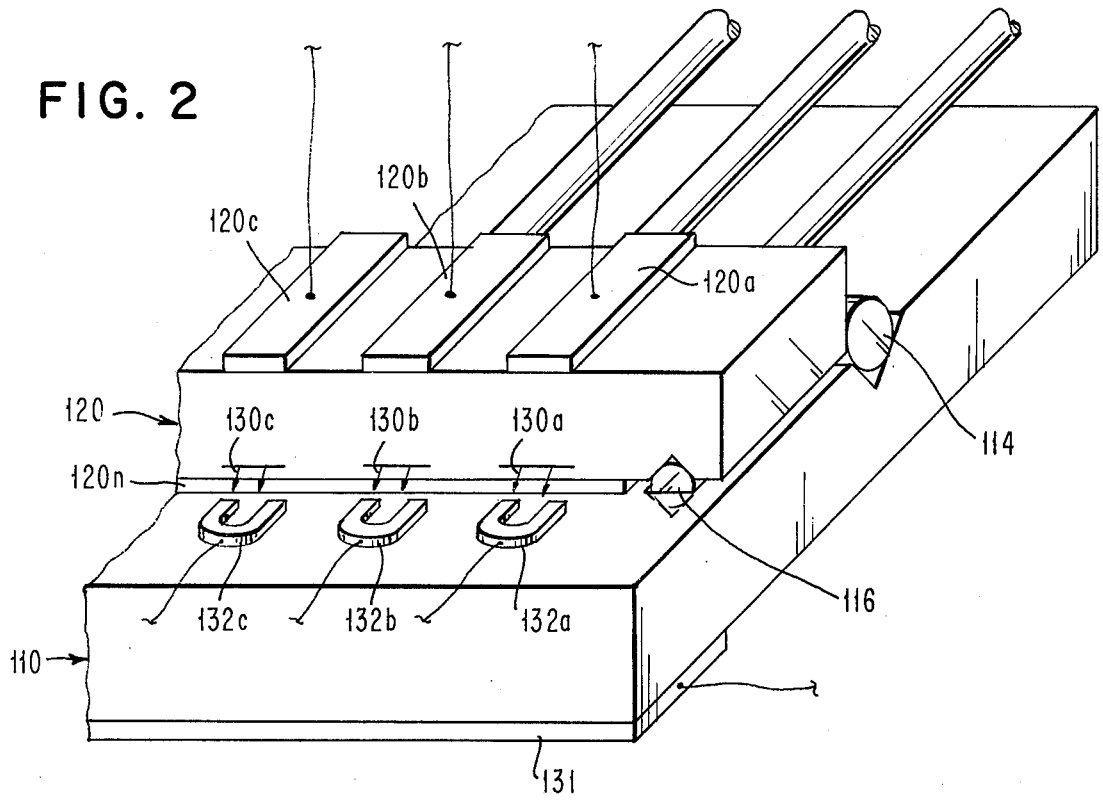
FIG. 2 is another perspective view of an optical assembly in accordance with the present invention with laser output monitoring apparatus.

Other apparatus for monitoring the output of the individual lasers is shown in FIG. 2. This figure differs from FIG. 1 in that the positions of the common electrode and individual electrode are reversed. This removes the contacts from the wafer 10 and allows a photodetector to be fabricated within the silicon substrate for each of the lasers. Since the light from the lasing junction diversed at 40°-55°, the radiation exiting from the rear surface will irradiate the photodetectors. The rear mirror is made sufficiently transmissive to permit the escape of just enough radiation to affect the photodetector.

Specificaly, in FIG. 2 the substrate 110 is fabricated with the identical grooves for aligning the fibers, the cylindrical lens, and the aligning rails as in FIG. 1. A common electrode 131 for the photodetectors 130a-130c (only three being illustrated) is deposited on the underside of the wafer 110. The photodetectors are formed as a diffused P-N junction in the p type silicon wafer material with an overlying horseshoe-shaped electrode 132a-132b-132c to which individual wired connections are made.

The laser array 120 is identical to that of FIG. 1 except for the reversal of the common electrode and the individual electrode 120a-120m (of which only three are shown). With this arrangement of photodetectors the output of each laser may be monitored, and if the servo loop is closed, the output may be controlled to maintain a predetermined level.

A final extrapolation of the principles of the invention is illustrated in FIG. 3 which interposes a modulator, or light valve between the laser package and the output waveguides. This light package is typically fabricated of an electro-optical matrial with a common electrode 230n and a plurality of individual electrodes 230a-230m on the opposite face of te wafer. The wafer 230 is aligned with the substrate 210 by means of complementary geometry shapes as previously described and abuts both the cylindrical lens 216 and the optical fibers 212a-212m.

The modulator 210 could equally well be fabricated directly on the silicon substrate by successive depositions of the electrode, the electro-optical layer and the individual electrodes. The laser may also be a continu0us wave laser, segmented only to insure lasing action in the region opposite the fibers and gated or modulated only by the modulator package 230. Other forms of modulators, such as magneto-optical and acousto-optical modulators can also be substituted and aligned by means of the groove and rail structure.

Several embodiments of an integrated optical ssembly have been described. All of these effect the critical alginment of the active and passive optical instrumentalities by means of preferentially etched complementary geometric shapes. Silicon has been described as the preferred material for the substrate because of the ease with which it may be preferentially etched and because it makes a good heat sink. The principle of the invention, however, can be equally applied to other materials. Therefore, it is to be understood by those skilled in the art that various changes in form and detail may be made therein without deparing from the spirit of the invention.

What is claimed is:

1. An optical assembly comprising:
   a first structural member having a plurality of parallel Vee-shaped grooves opening into one face thereof and another groove perpendicular to and intersecting said plurality of grooves;
   a cylindrica lens laid into said perpendicularly oriented groove;
   a plurality of optical fibers laid into said plurality of grooves with their ends aligned with said cylindrical lens;
   a solid state laser array having end faces defining a lasing cavity and a plurality of electrodes operable when potentialized to produce a population inversion to stimulate emissions in said cavity in a plurality of parallel paths, the said array being affixed to said structural member with one of its cavity end faces in juxtoposition to said cylindrical lens.

2. The optical assembly of claim 1 wherein said first structural member and said laser array are provided with complementary geometric shapes which interactively coact to fix the relative position of the two elements.

3. The optical assembly of claim 2 wherein said complementary geometric shapes comprise a Vee-shaped groove in each of the said member and said laer array with an interposed cylindrical rail.

4. The optical assembly of claim 2 wherein said complementary geometric shapes comprise a pyramidal pocket in each of said member and said laser array with an interposed sphere.

5. The optical assembly of claim 2 wherein said complementary geometric shapes comprise a mortise in one of the mating parts and a complementary tenon in the other.

6. The optical assembly of claim 1 wherein said structural member is provided with a plurality of contact members having a spacing of the electrodes on said laser array when said laser array is affixed to said structural member.

7. An optical assembly comprising:
   a first member having a plurality of grooves therein, and a plurality of active semiconductor devices, a second member having a plurality of solid state laser devices and a plurality of grooves therein;

means coacting with the grooves in both said first and second members for fixing the relative orientation of the two members when they abut;

a cylindrical lens and a plurality of optical fibers disposed in further grooves in said structural member whereby radiation produced by said solid state laser devices is coupled by said cylindrical lens into said optical fibers and said active semiconductor devices are coupled to receive additional radiation from said laser devices.

8. The optical assembly of claim 7 wherein said first member is fabricated of silicon.

9. The optical assembly of claim 8 wherein said silicon is of p type and additional dopants are added thereto to form a plurality of discrete diffused P-N junctions sensitive to light and disposed within the radiation of each of said solid state laser devices.

10. The optical assembly of claim 8 wherein silicon is P-type and additional dopants are added thereto to form a plurality of P-N junctions which when back-biased are sensitive to the thermal radiation of each of said laser devices.

* * * * *